(12) United States Patent
Vezyrtzis et al.

(10) Patent No.: US 12,025,658 B2
(45) Date of Patent: Jul. 2, 2024

(54) CIRCUIT STRUCTURE TO MEASURE OUTLIERS OF PROCESS VARIATION EFFECTS

(71) Applicant: Bitmain Development Inc., Dover, DE (US)

(72) Inventors: Christos Vezyrtzis, San Jose, CA (US); Peter Holm, Seattle, WA (US); Steve Beccue, Frazier Park, CA (US)

(73) Assignee: BITMAIN DEVELOPMENT INC., Dover, DE (US)

( * ) Notice: Subject to any disclaimer, the term of this patent is extended or adjusted under 35 U.S.C. 154(b) by 0 days.

(21) Appl. No.: 17/246,065

(22) Filed: Apr. 30, 2021

(65) Prior Publication Data

US 2022/0349938 A1    Nov. 3, 2022

(51) Int. Cl.
*G01R 31/3177*    (2006.01)
*G01R 31/26*    (2020.01)
*G01R 31/30*    (2006.01)
*H03K 3/03*    (2006.01)

(52) U.S. Cl.
CPC ......... *G01R 31/3177* (2013.01); *G01R 31/26* (2013.01); *G01R 31/3004* (2013.01); *G01R 31/3016* (2013.01); *H03K 3/0315* (2013.01)

(58) Field of Classification Search
CPC ............ H03K 3/0315; G01R 31/30016; G01R 31/3004; G01R 31/3177; G01R 31/26
USPC ......... 327/149, 146; 375/371; 331/16, 46, 2, 331/57
See application file for complete search history.

(56) References Cited

U.S. PATENT DOCUMENTS

| | | | |
|---|---|---|---|
| 6,177,845 B1 * | 1/2001 | Moll | H03B 21/025 327/146 |
| 2002/0084797 A1 * | 7/2002 | Samaan | G01R 31/31858 324/750.3 |
| 2003/0231069 A1 * | 12/2003 | Chiang | H03L 7/18 331/45 |

* cited by examiner

*Primary Examiner* — Arnold M Kinkead
(74) *Attorney, Agent, or Firm* — Jon E. Gordon; Haug Partners LLP

(57) ABSTRACT

Embodiments of the invention provide for integrated circuits for testing one or more transistors for process variation effects. According to an embodiment, the integrated circuit can include: a plurality of ring oscillator macro circuits, wherein each ring oscillator macro circuit includes two ring oscillators, a first multiplexer, and a first divide-by-two circuit; a multiplexer stage; a divide-by-two circuit stage; a second multiplexer; a second divide-by-two circuit; and frequency measurement circuit. According to another embodiment, the integrated circuit can include: a first shift register including a plurality of devices-under-test; a second shift register including a plurality of static latches; a first multiplexer configured to receive outputs from each of the plurality of DUTs; a second multiplexer configured to receive outputs from each of the plurality of static latches; and a comparator configured to compare an output from the first multiplexer with an output from the second multiplexer.

16 Claims, 7 Drawing Sheets

Test Circuit 200

CIRCUIT STRUCTURE TO MEASURE OUTLIERS OF PROCESS VARIATION EFFECTS

BACKGROUND

In modern complementary metal-oxide-semiconductor (CMOS) processes, there are numerous parameters that affect a transistor's "on-current", i.e., the current during the (strong or weak) inversion region of operation and a transistor's "off-current", i.e., the current during the cutoff region of operation (when $V_{GS}=0$). Such parameters include channel doping, channel length, fin height, gate k variation, etc. During integrated circuit design, all of these effects will ideally be lumped into one "high-level" parameter variation, e.g., variation of the transistor's threshold voltage or $V_{th}$. With this, the current I can be accurately predicted, i.e., current $I=I_{ideal}*V_{GS}-V_{th})^2$ or current $I=I_{ideal}e^{-Vth}$.

In this regard, for integrated circuits designed for extreme conditions, e.g., high temperature, high voltage, high alpha particles, etc., measuring extreme variation in any outlier transistor becomes critical. However, with many of today's integrated circuits including tens of millions, if not hundreds of millions, of transistors, the known measurement techniques are slow and imprecise.

In particular, for parameters that affect a transistor's "on-current", many of the known measurement techniques require transporting critical signals off the test chip and/or lump multiple test devices into a single measurement circuit, thereby (1) failing to isolate variation effects affecting single transistors, and (2) increasing measurement time required to measure the properties of many devices-under-test (DUTs).

Further, for parameters that affect a transistor's "off-current", many of the known measurement techniques involve analog techniques, require measuring only one device a time, and usually require a large measurement time. For example, one known measurement technique involves feeding outputs from isolated MOS transistors to operational amplifier (opamp) type measurement circuits, which compare a device-under-test's (DUT) leakage to a known reference current. This requires the two currents to charge up large capacitors to build voltage. But because the currents are small, a lot of time is needed to build up a significant voltage difference. Further, these measurement techniques also require significant area for the analog components (e.g., capacitors, opamps). In this regard, the analog components are larger so that their noise & offsets are small compared to the DUT's leakage. Further, another known solution is to measure the leakage of many of the transistors combined. But this masks the presence of any potential significant outliers, which need to be detected.

Accordingly, for parameters that affect a transistor's "on-current", it would be desirable to have systems and methods that measure the lumped effect of all process parameters that affect the speed and threshold voltage variation of MOS transistors in their inversion state, while spending minimal time to perform such measurements over many devices (in the orders of millions, or tens of millions, or possibly more) in order to measure the extreme variation outlier devices.

Similarly, for parameters that affect a transistor's "off-current", it would be desirable to have systems and methods that measure the lumped effect of all process parameters that affect the speed and threshold voltage variation of MOS transistors in their leakage state, while spending minimal time to perform such measurements over many devices (in the orders of millions, or tens of millions, or possibly more) in order to measure the extreme variation outlier devices.

BRIEF SUMMARY OF THE INVENTION

Embodiments of the invention relate to an integrated circuit for testing one or more transistors for process variation effects.

According to an embodiment, the integrated circuit may include a plurality of ring oscillator macro circuits. In this regard, each ring oscillator macro circuit can include two oscillators, wherein each ring oscillator includes an odd number of inverter stages. Further, each inverter stage may include one or more transistors, wherein each ring oscillator is associated with an output signal. Further, each ring oscillator macro circuit may also include a first multiplexer configured to receive the output signals associated with the two ring oscillators, and, provide, as an output, one of the output signals associated with the two ring oscillators. Further, each ring oscillator macro circuit may also include a first divide-by-two circuit, wherein the first divide-by-two circuit is configured to receive the output from the first multiplexer and provide an oscillating signal that is at half of the frequency of the output from the first multiplexer.

According to an embodiment, the integrated circuit may also include a multiplexer stage including a plurality of multiplexers, wherein each multiplexer of the multiplexer stage is configured to receive an output from a corresponding ring oscillator macro circuit.

According to an embodiment, the integrated circuit may also include a divide-by-two circuit stage including a plurality of divide-by-two circuits, wherein each divide-by-two circuit is configured to receive an output from each of the multiplexers of the multiplexer stage.

According to an embodiment, the integrated circuit may also include a second multiplexer configured to receive an output from each of the divide-by-two circuits in the divide-by-two circuit stage.

According to an embodiment, the integrated circuit may also include a second divide-by-two circuit configured to receive an output from the second multiplexer.

According to an embodiment, the integrated circuit may also include a frequency measurement circuit configured to measure the frequency of an output from the second divide-by-two circuit. In this regard, the frequency measurement circuit may include a first counter and a second counter. According to an embodiment, the first counter increments at every positive transition of the output from the second divide-by-two circuit, and the second counter increments at every positive transition of a reference clock.

According to an embodiment, each inverter stage can include an inverter. In an alternative embodiment, each inverter stage can include a NAND gate. In this regard, the NAND gate can be a NAND2 gate. Further, the NAND2 gate can replace the inverter stage, receiving an additional pin called "enable," which is distinct for each ring oscillator. According to another embodiment, the inverter stage can be a NAND3 circuit. According to another embodiment, the inverter stage can be an inverter with m-stacked N-MOS transistors and m-stacked P-MOS transistors, where m refers to an integer ≥2. Further, according to another embodiment, the inverter stage can be an inverter with a plurality N-MOS and P-MOS transistors in parallel with each other.

According to another embodiment, leakage can be measured by measuring the pass/fail property of dynamic latches at variable operating frequencies. In this regard, multiple DUTs can be measured at the same time without needing to address the problems associated with analog devices such as noise and calibrations.

According to an embodiment, the integrated circuit may include a first shift register including a plurality of DUTs. In this regard, the plurality of DUTs can be dynamic latches including the one or more transistors. Further, the integrated circuit may also include a second shift register including a plurality of static latches. Further, the integrated circuit may also include a first multiplexer configured to receive outputs from each of the plurality of DUTs. Further, the integrated circuit may also include a second multiplexer configured to receive outputs from each of the plurality of static latches. Further, the integrated circuit may also include a comparator configured to compare an output from the first multiplexer with an output from the second multiplexer.

According to an embodiment, each DUT can include one of a low threshold voltage transistor or an ultra-low voltage threshold transistor.

According to an embodiment, the dynamic latches can be transmission-gate dynamic latches.

According to an embodiment, each DUT can include a respective 2-to-1 multiplexer.

According to an embodiment, the comparator can be an Exclusive OR (XOR) gate.

According to an embodiment, more than one of the plurality of DUTs can receive the same data signal.

BRIEF DESCRIPTION OF THE DRAWINGS

Some aspects of the disclosure are herein described, by way of example only, with reference to the accompanying drawings. With specific reference now to the drawings in detail, it is stressed that the particulars shown are by way of example and are for purposes of illustrative discussion of embodiments of the disclosure. In this regard, the description, taken with the drawings, makes apparent to those skilled in the art how aspects of the disclosure may be practiced.

DETAILED DESCRIPTION OF PREFERRED EMBODIMENTS

This description is not intended to be a detailed catalog of all the different ways in which the disclosure may be implemented, or all the features that may be added to the instant disclosure. For example, features illustrated with respect to one embodiment may be incorporated into other embodiments, and features illustrated with respect to a particular embodiment may be deleted from that embodiment. Thus, the disclosure contemplates that in some embodiments of the disclosure, any feature or combination of features set forth herein can be excluded or omitted. In addition, numerous variations and additions to the various embodiments suggested herein will be apparent to those skilled in the art in light of the instant disclosure, which do not depart from the instant disclosure. In other instances, well-known structures, interfaces, and processes have not been shown in detail in order not to unnecessarily obscure the invention. It is intended that no part of this specification be construed to affect a disavowal of any part of the full scope of the invention. Hence, the following descriptions are intended to illustrate some particular embodiments of the disclosure, and not to exhaustively specify all permutations, combinations and variations thereof.

Unless explicitly stated otherwise, the definition of any term herein is solely for identification and the reader's convenience; no such definition shall be taken to mean that any term is being given any meaning other than that commonly understood by one of ordinary skill in the art to which this disclosure belongs, unless the definition herein cannot reasonably be reconciled with that meaning. Further, in the absence of such explicit definition, all technical and scientific terms used herein have the same meaning as commonly understood by one of ordinary skill in the art to which this disclosure belongs. The terminology used in the description of the disclosure herein is for the purpose of describing particular embodiments only and is not intended to be limiting of the disclosure.

Figure 1:
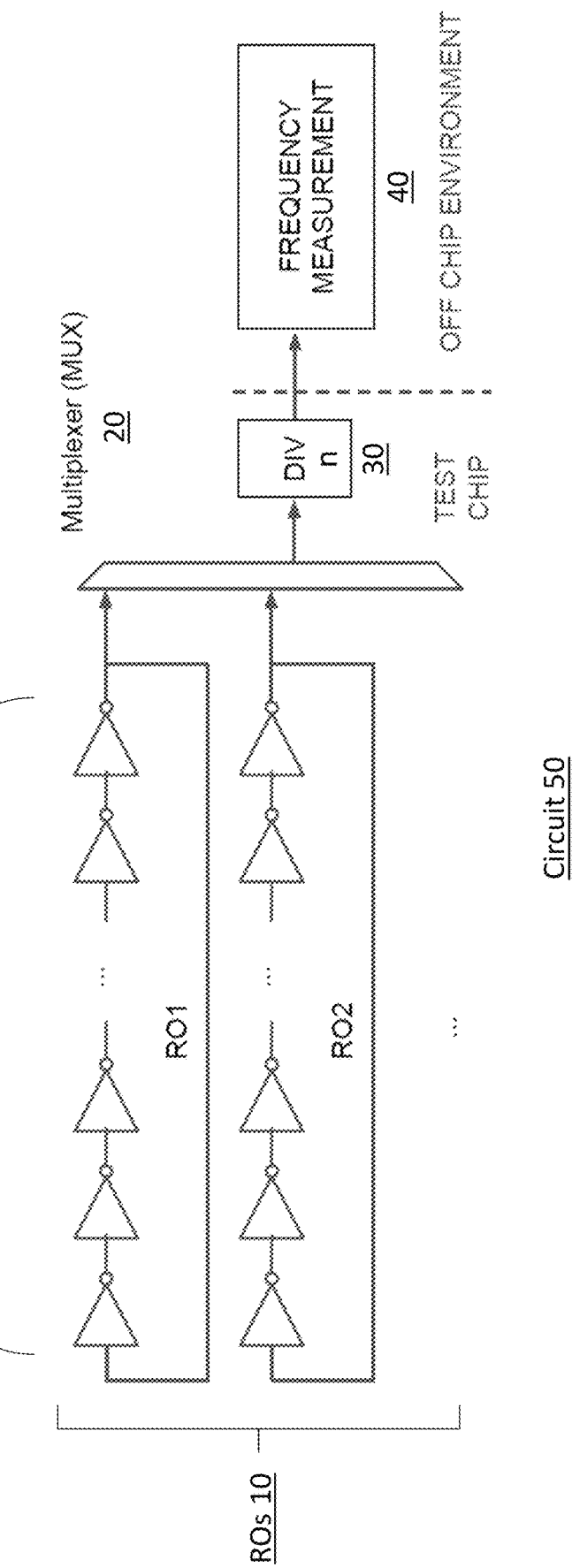
FIG. 1 depicts a test circuit for measuring process variations in transistors.

FIG. 1 depicts a test circuit for measuring process variations in transistors. As depicted in the figure, a test circuit 50 can include a plurality of ring oscillators (ROs) 10, a multiplexer 20, and a divide-by-n circuit 30 (wherever a divide-by-n circuit appears in the disclosure, n refers to an integer ≥2 unless explicitly stated otherwise). According to an embodiment, each of the plurality of ring oscillators 10 can include a plurality of inverter stages corresponding to respective inverters 5. In this regard, the ring oscillators 10 can include an odd number of inverter stages. Further, each inverter 5 can include a P-channel metal-oxide-semiconductor (P-MOS) transistor and an N-type metal-oxide-semiconductor (N-MOS) transistor. As such, the test circuit 50 can be used to measure the process variation in N-MOS and P-MOS transistors associated with each inverter 5.

Further, as depicted in the figure, the inverters 5 are in a loop, thereby making them free-running. As such, the signal going through each ring oscillator 10 is always oscillating. Further, according to an embodiment, the multiplexer 20 has as many inputs as there are ring oscillators 10. As such, the multiplexer 20 can be used to choose an output signal associated with one of the plurality of ring oscillators 10, wherein each output signal (due to process variations) is oscillating at a different frequency. The selection of one of the ring oscillators' 10 output by the multiplexer 20 can be done by providing the appropriate multi-bit digital "select" signal to the multiplexer 20. For example, for a 8-input multiplexer 20, there will be a 3-bit digital select signal, where: a value of 000 on this signal will program the multiplexer 20 to propagate its first input to its output; a value of 001 will select the second input, etc. Then, after a particular ring oscillator output signal is selected, the frequency of the output signal can be divided by an integer n by a divide-by-n circuit 30 so that the output signal can be safely transferred off-chip to a frequency measurement circuit 40, where the frequency of the output signal can be accurately measured. In this way, the variation in output frequency can provide information about the transistor threshold voltage of the N-MOS and P-MOS transistors associated with a particular inverter 5. In particular, if all of the ring oscillators' frequencies are measured at the same power supply voltage $V_{DD}$, then the variation in output frequency can be used to derive the variation of the N-MOS and P-MOS threshold voltage $V_{th}$. In this regard, a larger $V_{th}$ variation leads to larger ring oscillator frequency variation. The period (inverse of a frequency) of a ring oscillator 10 is approximately proportional to the sum of the overdrive ($V_{DD}-V_{th}$) voltages of each stage. Further, due to process variation, each stage will have a slightly different $V_{th}$. Therefore, the variance of the ring oscillators' period will be proportional to the sum of variances of the delays of the inverter stages (which should be the same since all the inverters are the same). In this way, the variance of the delay of one inverter stage can be calculated.

However, in order to make the circuit 50 robust, the ring oscillator signals need to be able to travel the large on-chip distances between the ring oscillator 10 and the multiplexer 20 without disappearing (which could happen if the signals are too fast). To solve this problem, the ring oscillators 10 would require many inverter stages, so that their output frequency is slower. However, a large number of inverter stages will average out the variation of the individual stages. For example, in a ring oscillator with fifty stages, a 20% slower stage will only result in approximately 0.4% slower output. In other words, it will likely be very hard to isolate outlier devices since they will most likely be "masked" in larger ring oscillators. Further, because the frequency measurement is done off-chip, the total measurement time increases due to the need to synchronize the equipment, etc.

Figure 2:
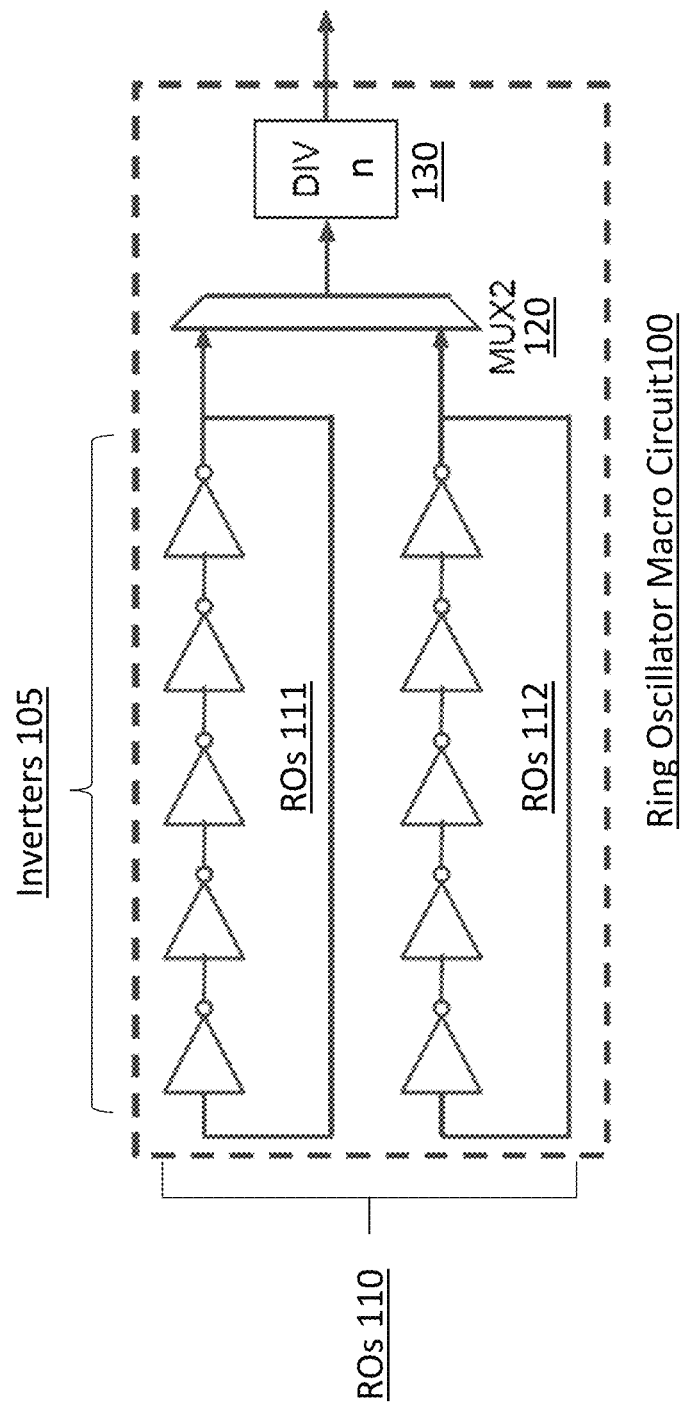
FIG. 2 depicts an exemplary ring oscillator macro circuit for measuring process variations in transistors according to an embodiment of the invention.

FIG. 2 depicts an exemplary ring oscillator macro circuit for measuring process variations in transistors according to an embodiment of the invention. As depicted in the figure, a ring oscillator macro circuit 100 can include two ring oscillators 100, e.g., ring oscillators 111 and 112, a multiplexer 120, and a divide-by-n circuit 130. According to an embodiment, each ring oscillator is associated with a plurality of inverter stages corresponding to respective inverters 105. In this regard, the ring oscillators 111 and 112 can include an odd number of inverter stages. For example, as depicted in the figure, each ring oscillator can include five stages and, therefore, inverters. However, according to another embodiment, each ring oscillator can include seven stages and, therefore, inverters. Further, according to another embodiment, each ring oscillator can include three stages, which is the minimum number of stages for an oscillator to oscillate. Further, each inverter 105 can include a P-MOS transistor and an N-MOS transistor. Further, as depicted in the figure, the inverters 105 are in a loop, thereby making them free-running. As such, the signal going through each ring oscillator is always oscillating. Further, according to an embodiment, the multiplexer 120 includes two inputs, which correspond, respectively, to the outputs of the two ring oscillators 112 and 112, and a "select" signal that selects which of the two inputs to propagate, and is unique for each ring oscillator macro circuit 100. As such, the multiplexer 120 can be used to choose an output signal associated with one of the plurality of ring oscillators 10, wherein each output signal (due to process variations) is oscillating at a different frequency, by choosing the proper "1" or "0" value so that the second or first input is selected, respectively. Further, because the output signals go through a small number of inverter stages, they can still maintain a relatively high frequency. Accordingly, unlike the test circuit 50, extreme outliers are no longer masked by a large number of inverter stages and, therefore, can be identified. Then, after a particular ring oscillator output signal is selected, the frequency of the output signal can be divided by two by a divide-by-n circuit 130 so that the output signal can be slowed down and sent across larger distances.

According to an embodiment, instead of inverters, the inverter stages can include a NAND gate, e.g., a NAND2 gate. In this regard, the transistors to be tested can be the transistors that form the NAND gate. According to an embodiment, the NAND gate can be disabled while it's not being measured (along with the entire ring oscillator). To disable a particular ring oscillator, an external "enable" signal (which is unique to each ring oscillator 112) can be set to "0", which forces the NAND2 gate to a "1" output, resulting in no feedback and, therefore, no oscillations in the ring oscillator loop. Further, in order to measure a particular ring oscillator, the "enable" signal can be set to a logic 1. According to another embodiment, the inverter stage can be a NAND3 circuit. According to another embodiment, the inverter stage can be an inverter with m-stacked N-MOS transistors and m-stacked P-MOS transistors, where m refers to an integer ≥2. Further, according to another embodiment, the inverter stage can be an inverter with a plurality N-MOS and P-MOS transistors in parallel with each other.

Figure 3:
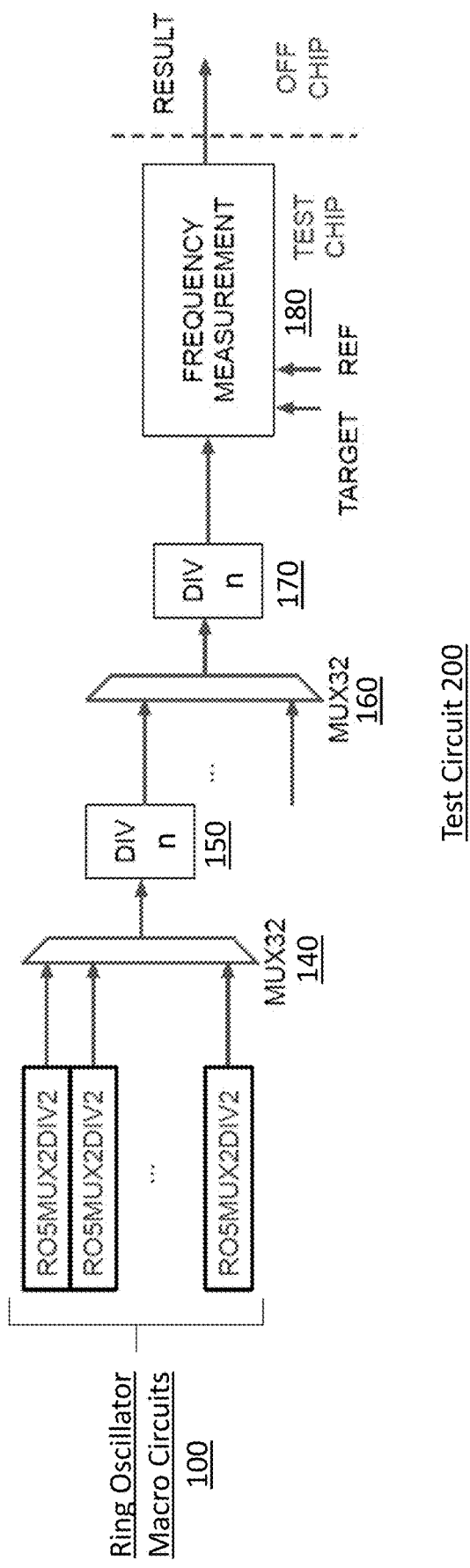
FIG. 3 depicts an exemplary test circuit for measuring process variations in transistors according to an embodiment of the invention.

FIG. 3 depicts an exemplary test circuit for measuring process variations in transistors according to an embodiment of the invention. As depicted in the figure, a test circuit 200 can include a plurality of ring oscillator macro circuits 100, a multiplexer stage 140 including a plurality of multiplexers, a first divide-by-n circuit stage 150 including a plurality of divide-by-n circuits, a multiplexer 160, a divide-by-n circuit 170, and an on-chip frequency measurement circuit 180.

According to an embodiment, each multiplexer of the first multiplexer stage 140 can include thirty-two inputs, which can correspond to the respective output signals of the thirty-two ring oscillator macro circuits 100. In this regard, each 32-to-1 multiplexer can select (e.g., through appropriate digital "select" bits) one of the respective output signals to propagate. For example, the 32-to-1 multiplexer can include an additional 5-bit input "select", whose value selects which one of the inputs to propagate to the output. For example, "00000" selects the first input, "00001" selects the second input, etc. However, according to another embodiment, instead of thirty-two inputs, the multiplexers can include a different number of inputs. Further, according to an embodiment, the first multiplexer stage 140 can include 32 multiplexers. Further, according to another embodiment, the first multiplexer stage 140 can include a different number of multiplexers.

According to an embodiment, each multiplexer of the first multiplexer stage 140 includes an associated divide-by-n circuit of the divide-by-n circuit stage 150 that receives the selected ring oscillator output signal as input and produces, as an output, an oscillating signal at precisely (1/n)-th the input signal's frequency. Further, according to an embodiment, if there are thirty-two multiplexers in the multiplexer stage 140, then there are thirty-two divide-by-n circuits in the divide-by-n circuit stage 150. According to another embodiment, if there are a different number of multiplexers in the multiplexer stage 140, then there are an equivalent number of divide-by-n circuits in the divide-by-n circuit stage 150.

According to an embodiment, the multiplexer 160 can receive, as inputs, the outputs from each of the divide-by-n circuits in the divide-by-n circuit stage 150. As such, the multiplexer 160 can select (e.g., through appropriate digital "select" bits) one of the output signals from the divide-by-n circuits in the divide-by-n circuit stage 150 to propagate. According to an embodiment, there are as many inputs to the multiplexer 160 as there divide-by-n circuits in the divideby-n circuit stage 150. As such, if there are thirty-two divide-by-n circuits in the divide-by-n circuit stage 150, then there are thirty-two inputs to the multiplexer 160.

According to an embodiment, the output of the multiplexer 160 can be provided, as an input, to the divide-by-n circuit 170, which then produces, as an output, an oscillating signal at precisely (1/n)-th the input signal's frequency.

Further, according to an embodiment, the test circuit 200 can include a multi-bit digital signal called "address" (not shown), which can be used to select a ring oscillator to measure at any particular time. The width of the address signal (i.e., number of bits) is appropriately chosen so that any ring oscillator can be chosen. For example, if the test circuit 200 has 1024 ring oscillator macro circuits 100, then the total number of ring oscillators is 2*1024 (or 2048) and, therefore, the address signal needs to be 11-bits wide. In this regard, the 11-bit address signal can be used as follows: (a) the 5 most-significant bits (MSBs) of the address signal can be used to control the multiplexer 160; (b) the next 5 bits can be used to control the multiplexers in the multiplexer stage 140; and (c) the least-significant bit (LSB) can be used to control the multiplexer 120. According to another embodiment, the LSB can be used to control the "enable" pin of the two oscillators inside the circuit 100 by driving the additional pin of the NAND2 gate, thereby only enabling the ring oscillator that is to be measured and ensuring that the other one does not oscillate.

According to an embodiment, the oscillating signal output by the divide-by-n circuit 170 can have its frequency measured by the on-chip frequency measurement circuit 180. In this regard, the on-chip frequency measurement circuit 180 can include a first counter, which increments at every positive transition of the oscillating signal output by the divide-by-n circuit 170, and a second counter, which (i) operates with a reference clock signal, (ii) increments at every positive transition of the reference clock, and (iii) counts up to a predetermined number of reference clock cycles. Accordingly, the frequency of the oscillating signal output by the divide-by-n circuit 170 can be determined as follows: f(RO)=f(REF)*Count1/Count2, where f(RO) corresponds to the frequency associated with a particular ring oscillator output signal, f(REF) corresponds to the frequency of the reference clock, Count1 corresponds to the count number determined by the first counter, and Count2 corresponds to the count number determined by the second counter. Further, based on the determined frequency of each of the ring oscillators, the variance of the inverter delay used to build the ring oscillators can also be calculated. This can be done by inputting the determined frequency data into a computer program which: (i) performs a statistical analysis of the ring oscillator, i.e., by instantiating multiple instances of the experiment as described above, where each instance has a $V_{th}$ value which models the on-chip variation and which has a given variance, and (ii) adjusts the previously-described $V_{th}$ variance so that the experimental data gathered from the ring oscillators match those from the simulation (in terms of variance). Further, because the frequency measurement is performed on-chip, it is performed much faster than it would if it were performed off-chip.

Figure 4:
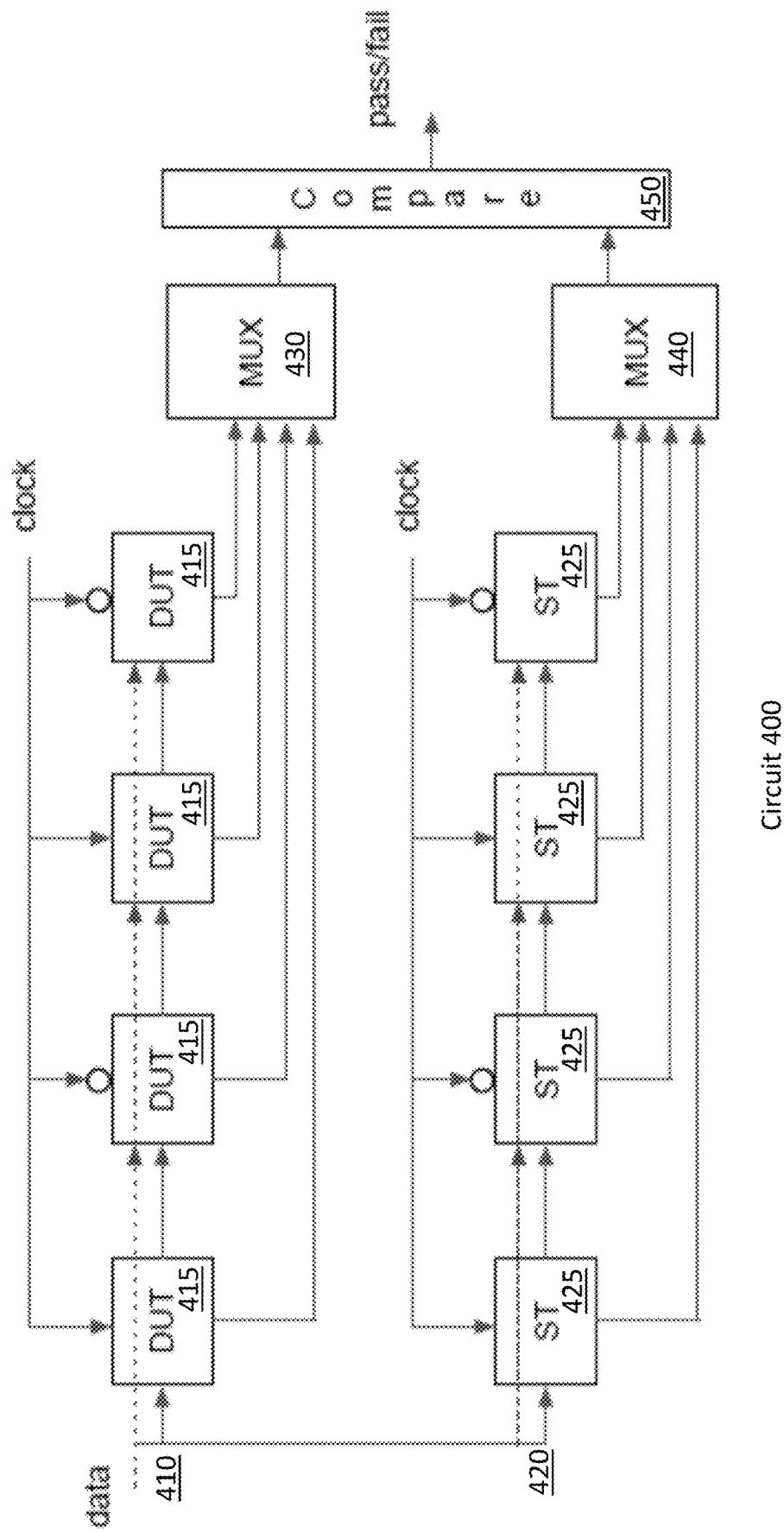
FIG. 4 depicts an exemplary test circuit for measuring process variations in transistors according to an embodiment of the invention.

FIG. 4 depicts an integrated circuit for measuring process variations in transistors. As depicted in the figure, a test circuit 400 can include a first shift register 410 comprised of a plurality of devices-under-test (DUTs) 415, a second shift register 420 comprised of a plurality of static latches 425, a first multiplexer 430, a second multiplexer 440, and a comparator 450.

According to an embodiment, the DUTs 415 can include dynamic latches. A dynamic latch is a latch that is not able to maintain its state forever. In particular, dynamic latches have "leakage" and lose their state at a given leakage rate. According to an embodiment, the DUTs 415 can be transmission-gate dynamic latches. According to another embodiment, the DUTs 415 can include low threshold voltage (LVT) or ultra-low threshold voltage (ULVT) transistors.

Further, as depicted in FIG. 4, some of the DUTs 415 and the static latches 425 include an inverter at their clock signal inputs (e.g., $2^{nd}$ and $4^{th}$ DUTs 415 and static latches 425 from the left) and, therefore, can receive a clock signal (which includes a clock positive signal and a clock negative signal) in reverse order.

Figure 5:
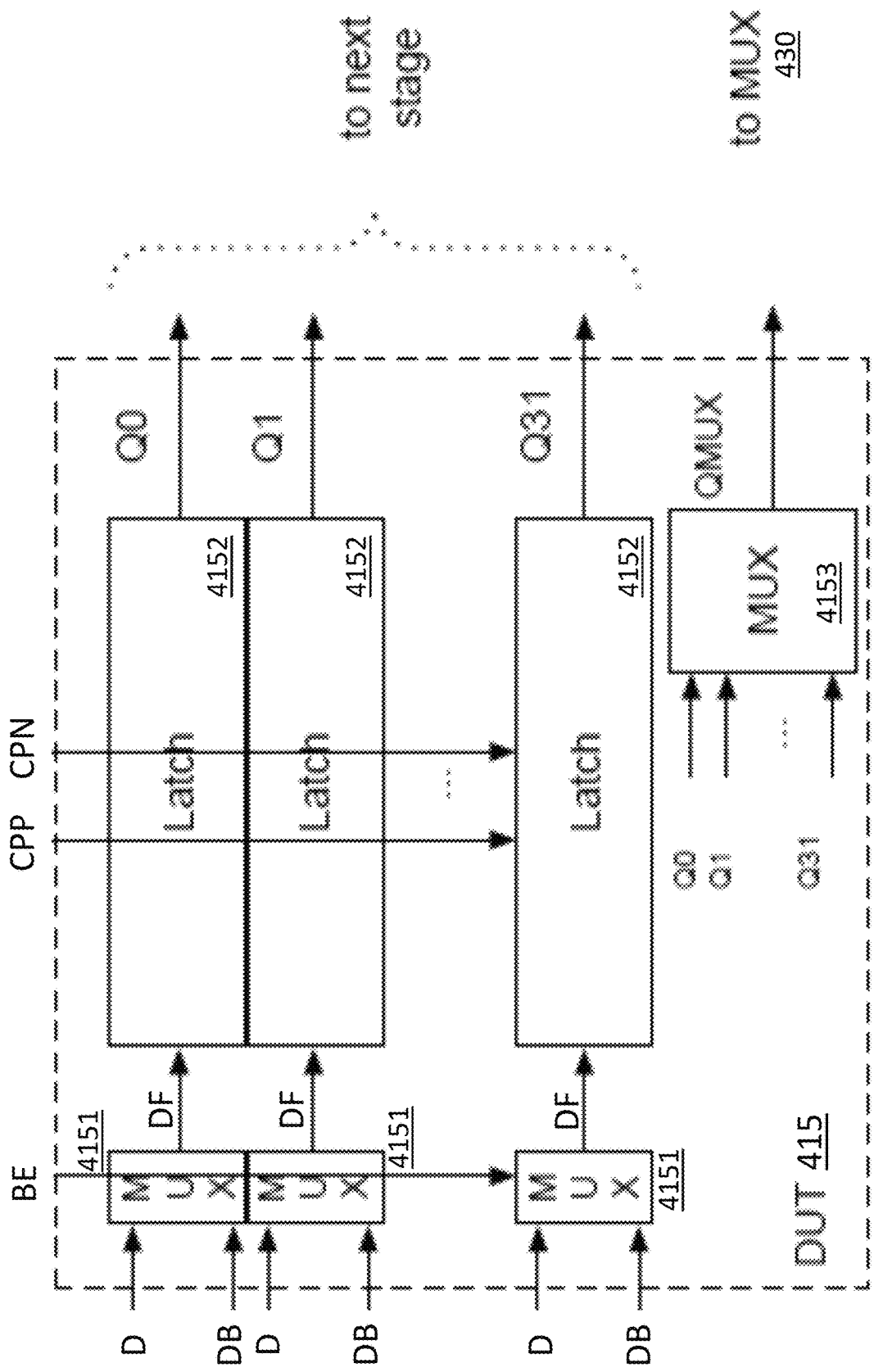
FIG. 5 depicts an exemplary device under test according to an embodiment of the invention.

FIG. 5 depicts an exemplary device under test according to an embodiment of the invention. For example, as depicted in the figure, in addition to at least one dynamic latch 4152, each of the DUTs 415 can include a plurality of inputs, e.g., data (D), bypass data (DB), bypass enable (BE), clock positive signal (CPP), and clock negative signal (CPN), and outputs, e.g., plurality of data outputs (QN) and an additional data output (QMUX), in which QMUX is equal to one of the QN outputs as selected by a particular multiplexer signal. Further, each DUT 415 can also include a 2-to-1 multiplexer 4151, with D and DB as inputs, BE as the select signal, and a data forward signal (DF) as the output. As such, based on a particular signal BE, the multiplexer 4151 can provide one of the inputs D and DB as the output DF. In this regard, the inputs D to each stage come from the previous stage (so they can be potentially different for each bit). Similarly, each DB input can also be different for each bit. Therefore, the outputs DF can be multiple signals (e.g., equal in number to D, DB, and QN). For example, if there are 32 latches per DUT 415, then there would be 32 D inputs (e.g., D[31], D[30], . . . , D[0]) and 32 DB inputs (DB[31], DB[30], . . . , DB[0]). Accordingly, each pair of D and DB signals of the same index can be provided to a corresponding 2-to-1 multiplexer 4151, and each multiplexer 4151 can output a DF signal of the same index, e.g., the $1^{st}$ multiplexer 4151 can choose between D[31] and DB[31] and produce DF[31], and so on. In other words, DF can be a 32-bit signal comprised of the 32 (potentially unique) DF signals DF[31], DF[30], . . . , DF[0].

Figure 6:
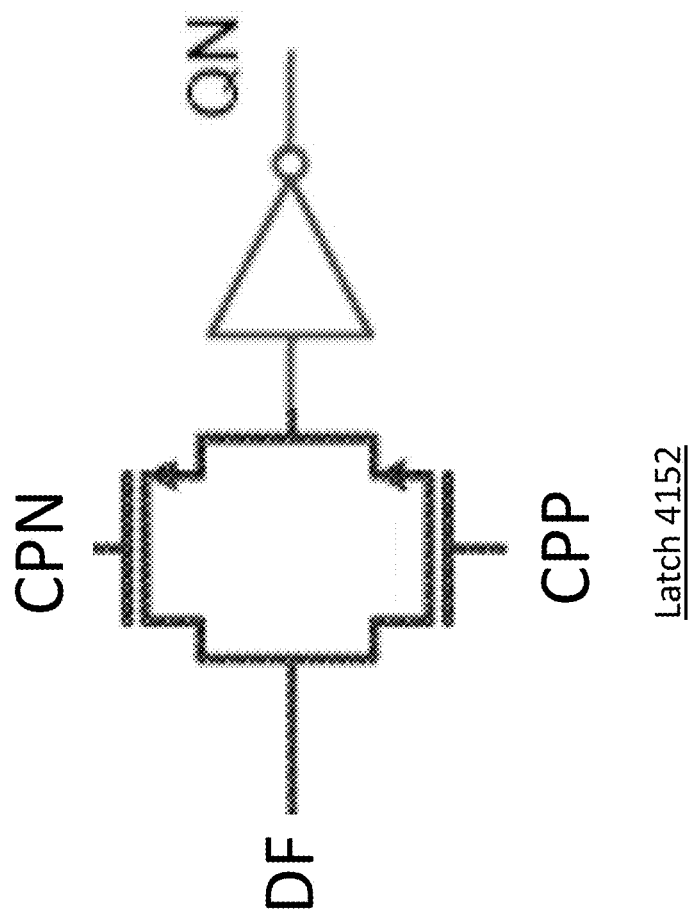
FIG. 6 depicts an exemplary dynamic latch according to an embodiment of the invention.

FIG. 6 depicts an exemplary dynamic latch according to an embodiment of the invention. As depicted in the figure, the dynamic latch 4152 can include one or more serially-placed transmission gates and an inverter. According to an embodiment, each transmission gate consists of: (a) one P-channel metal-oxide-semiconductor (P-MOS) transistor, with the gate connected to CPN, the drain to DF, and the source to the latch internal node; and (b) one N-type metal-oxide-semiconductor (N-MOS) transistor, with the gate connected to CPP, the drain to DF, and the source to the latch internal node. Further, the inverter can be connected between the latch internal node and the output QN. As such, each DUT 415 can include two leakage paths, when the dynamic latch keeps a logic 1 (e.g., through N-MOS) and when the dynamic latch keeps a logic 0 (e.g., through P-MOS).

According to an embodiment, the DUTs 415 can be in a shift-register configuration, with each DUT 415 receiving its predecessor's QN output as its D signal, each DUT 415 sharing the same CPP/CPN and DB signals (with some of the DUTs 415 receiving a clock signal in reverse order), and each DUT 415 receiving separate (and mutually exclusive)

DE signals. In this regard, the first DUT 415 of the first shift register 410 receives the input data at both its D and DB input ports.

According to an embodiment, the frequency for the clock signals CPP and CPN is programmable. In this regard, the variation in leakage can be observed by applying a number of different clock signal frequencies, e.g., from a lower frequency to a higher frequency. Further, if the clock signal=1, one of the DUT 415 latches can be transparent, and the latch next to it can be opaque. With this, the DUT leakage can be measured. For example, given a certain period (inverse of frequency), for CPP/CPN, each DUT has a clock signal=0 for half that time, and is leaking throughout this time (i.e., half the period). If the DUT leakage is large, then the DUT will lose its stored state by the time that this time (i.e., half the period) expires. By comparing the output of the DUT (which depends on its stored state) to the output of the corresponding static latch, it can be determined if the DUT leaked too much for the given clock frequency. In particular, if the DUT and the static latch have different outputs, then the DUT did leak too much, whereas if the DUT and static latch have the same output, then the DUT leakage is not too large for the given frequency. As such, by sweeping the frequency, we can characterize the leakage of all the DUTs.

Figure 7:
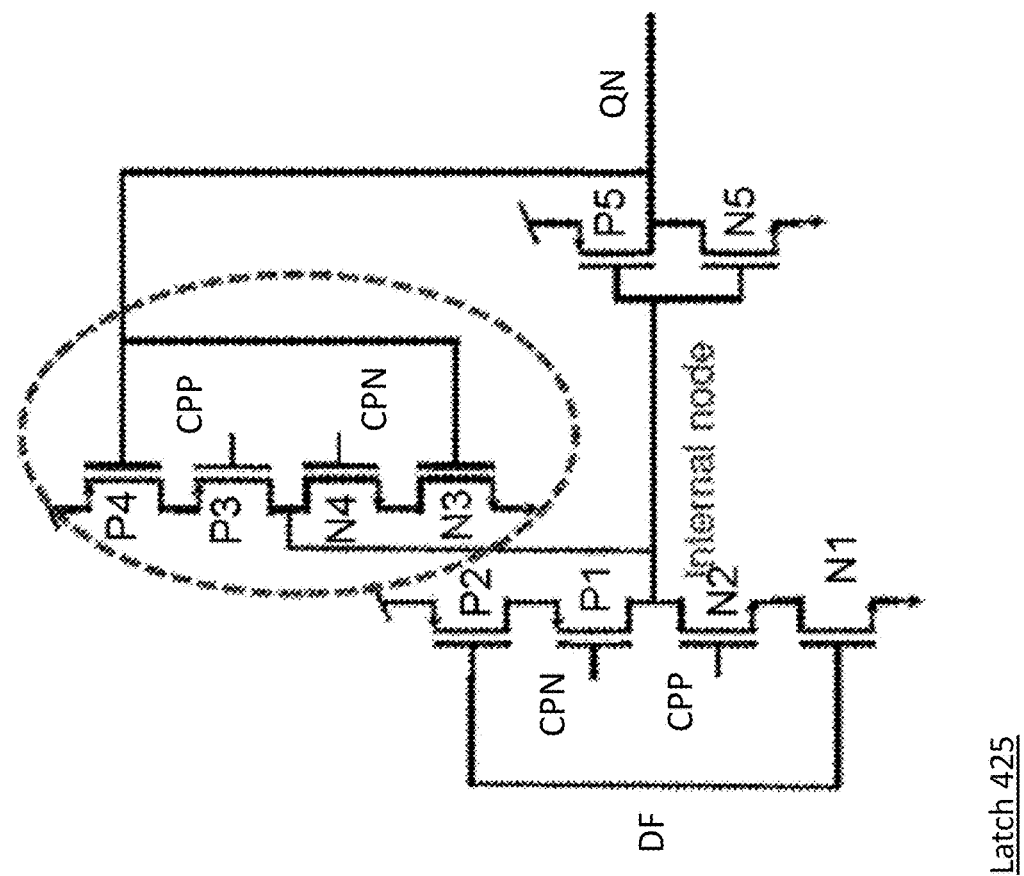
FIG. 7 depicts an exemplary static latch according to an embodiment of the invention.

According to an embodiment, the second shift register 420 is similar to the first shift register 410 but with static C-MOS latches replacing the combination of the transmission gates and inverters. In this regard, the static latches 425 receive the same clock and data as the DUTs 415. But unlike the DUTs 415, the static latches 425 never lose their data. In this regard, FIG. 7 depicts an exemplary static latch according to an embodiment of the invention. As depicted in FIG. 7, the static latch 425 can receive data DF and clock signals CPP and CPN and produce an output QN. Further, the static latch 425 can include a plurality of P-MOS (e.g., P1-P5) and N-MOS transistors (e.g., N1-N5). According to an embodiment, the static latch 425 can be configured to load data from the data input terminal DF when triggered by a high clock signal voltage (i.e., a binary "1" clock signal at the CPP terminal). The static latch 425 can be configured to hold its state during low clock signal voltage (i.e., a binary "0" clock signal at the CPP terminal).

Further, as depicted in FIG. 5, the DUT 415 can include a multiplexer 4153. In this regard, the multiplexer 4153 can receive all of the QN outputs as inputs as well as a select signal of appropriate bit width. Further, the multiplexer 4153 produces an output QMUX (e.g., one of the QN outputs) based on the select signal. According to an embodiment, the equivalent static latch 425 has a similar multiplexer (not shown), where the multiplexer in the static latch 425 and the multiplexer 4153 receive the same select signals. As such, after these multiplexers are selected, the leakage of a single bit of the DUT 415 can be observed, e.g., by comparing the output of the single bit of the DUT 415 to the corresponding bit in the static latch 425. Accordingly, by sweeping the select signal, the leakage of every bit of the DUT 415 can be observed.

According to an embodiment, the first multiplexer 430 can receive, as inputs, the outputs from the DUTs 415 and one of the respective DE signals. Further, the first multiplexer 430 can produce, as an output, one of the DUT 415 outputs based on the received DE signal. In this regard, a first DE signal value can correspond to the first DUT 415 (e.g., leftmost DUT), a second DE signal value can correspond to the second DUT 15 (e.g., second-to-left DUT), etc.

According to an embodiment, the second multiplexer 440 can receive, as inputs, the outputs from the static latches 425 and one the respective DE signals. Further, the second multiplexer 440 can produce, as an output, one of the latch 425 outputs based on the received DE signal. In this regard, the first DE signal value can correspond to the first static latch 425 (e.g., leftmost static latch), a second DE signal value can correspond to the second static latch 425 (e.g., second-to-left static latch), etc.

According to an embodiment, the comparator 450 compares the outputs of the DUTs 415, e.g., via the output of the first multiplexer 430, with the outputs of the static latches 425, e.g., via the output of the second multiplexer 440, to determine if a particular DUT 415 failed and, therefore, includes too much leakage. According to an embodiment, the comparator 450 can be a logic gate, e.g., an Exclusive OR (XOR) gate.

According to an embodiment, the leakage of a particular DUT 415 can be determined as follows: (i) a DUT 415 is selected, e.g., by selecting the DE signal associated with the DUT 415; (ii) within the DUT 415, a particular 1-bit DUT 4152 is selected using the multiplexer 4153 select signal; (iii) a particular clock frequency is selected; (iv) the shift register operations in the first shift register 410 and the second shift register 420 are initiated; and (v) at every cycle, the DUT 415 output is compared with the same position static latch 425 output. In this regard, if the DUT 415 output matches the corresponding static latch 425 output, then any leakage associated with the DUT 415 has not yet caused the DUT 415 output to switch values and, therefore, the DUT 415 can be considered as passing. On the other hand, if the DUT 415 output does not match the corresponding static latch 425 output, then any leakage associated with the DUT 415 has caused the DUT 415 output to switch values and, therefore, the DUT 415 can be considered as failing. Further, if one DUT 415 has too much leakage, then it will corrupt all the other DUTs 415 that follow it. The above process is repeated for all DUTs 4152 of every DUT 415, to characterize the leakage of all the 1-bit DUTs.

Further, according to an embodiment, the above method can be repeated for a "passing" DUT 415 but with a slightly-decreasing frequency (e.g., to increase the period and, therefore, the time the DUT is allowed to leak) until the DUT 415 fails. In this way, the failure-causing frequency can be determined for each DUT 415.

According to another embodiment, the leaky DUT 415 can be bypassed by sending data, e.g., via the signal DB, to the subsequent DUTs 415 and static latches 425 at once (as depicted by the dashed arrows in FIG. 1). In this regard, the non-leaky DUTs 415 and static latches 425 will receive a BE signal of "1," thereby enabling the DUT 415 and static latch 425 to receive data from the bypass data (DB) input port as opposed to the data (D) input port.

According to another embodiment, the DUTs 415 and static latches 425 can include thirty-two bits. In this regard, each of the DUTs 415 and the static latches 425 can receive an additional 5-bit control signal called "bit-select," which is identical for all the DUTs 415 and the static latches 425. Further, the first and second multiplexers can receive the additional 5-bit control signal and produce an output which is logically equivalent to the desired bit position (e.g., between 1 and 32) of the DUT 15 to be tested (e.g., 1 to 4) as encoded in the bit-select and DE signals.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

The foregoing detailed description of the present disclosure is to be understood as being in every respect illustrative and exemplary, but not restrictive, and the scope of the present disclosure provided herein is not to be determined solely from the detailed description, but rather from the claims as interpreted according to the full breadth and scope permitted by patent laws. It is to be understood that the embodiments shown and described herein are merely illustrative of the principles addressed by the present disclosure and that various modifications may be implemented by those skilled in the art without departing from the scope and spirit of the present disclosure. Those skilled in the art may implement various other feature combinations without departing from the scope and spirit of the present disclosure. The various functional modules shown are for illustrative purposes only, and may be combined, rearranged and/or otherwise modified.

The invention claimed is:

1. An integrated circuit for testing one or more transistors, the integrated circuit comprising:
    a plurality of ring oscillator macro circuits, wherein each ring oscillator macro circuit includes:
    two ring oscillators, wherein each ring oscillator includes an odd number of inverter stages, wherein the inverter stages include the one or more transistors, wherein each ring oscillator is associated with an output signal;
    a first multiplexer configured to receive the output signals associated with the two ring oscillators and provide as an output one of the output signals associated with the two ring oscillators; and
    a first divide-by-two circuit, wherein the first divide-by-two circuit is configured to receive the output from the first multiplexer and provide an oscillating signal that is at half of the frequency of the output from the first multiplexer;
    a multiplexer stage including a plurality of multiplexers, wherein each multiplexer of the multiplexer stage is configured to receive an output from a corresponding ring oscillator macro circuit;
    a divide-by-two circuit stage including a plurality of divide-by-two circuits, wherein each divide-by-two circuit is configured to receive an output from each of the multiplexers of the multiplexer stage;
    a second multiplexer configured to receive an output from each of the divide-by-two circuits in the divide-by-two circuit stage;
    a second divide-by-two circuit configured to receive an output from the second multiplexer; and
    a frequency measurement circuit configured to measure the frequency of an output from the second divide-by-two circuit.

2. The integrated circuit of claim 1, wherein the frequency measurement circuit includes a first counter and a second counter.

3. The integrated circuit of claim 2, wherein the first counter increments at every positive transition of the output from the second divide-by-two circuit.

4. The integrated circuit of claim 2, wherein the second counter increments at every positive transition of a reference clock.

5. The integrated circuit of claim 1, wherein each inverter stage includes an inverter.

6. The integrated circuit of claim 1, wherein each inverter stage includes a NAND gate.

7. The integrated circuit of claim 6, wherein the NAND gate is a NAND2 gate.

8. The integrated circuit of claim 1, wherein the inverter stage can be a NAND3 circuit.

9. The integrated circuit of claim 1, wherein the inverter stage can be an inverter with m-stacked N-MOS transistors and m-stacked P-MOS transistors, where m refers to an integer ≥2.

10. The integrated circuit of claim 1, wherein the inverter stage can be an inverter with a plurality of N-MOS and P-MOS transistors in parallel with each other.

11. An integrated circuit for testing one or more transistors, the integrated circuit comprising:
    a first shift register including a plurality of devices-under-test (DUT), wherein the plurality of DUTs are dynamic latches including the one or more transistors;
    a second shift register including a plurality of static latches;
    a first multiplexer configured to receive outputs from each of the plurality of DUTs;
    a second multiplexer configured to receive outputs from each of the plurality of static latches; and
    a comparator configured to compare an output from the first multiplexer with an output from the second multiplexer.

12. The integrated circuit of claim 11, wherein each DUT includes one of a low threshold voltage transistor and an ultra-low voltage threshold transistor.

13. The integrated circuit of claim 11, wherein the dynamic latches are transmission-gate dynamic latches.

14. The integrated circuit of claim 11, wherein each DUT includes a respective 2-to-1 multiplexer.

15. The integrated circuit of claim 11, wherein the comparator is an Exclusive OR (XOR) gate.

16. The integrated circuit of claim 11, wherein more than one of the plurality of DUTs receives the same data signal.

* * * * *